United States Patent
Kang et al.

(10) Patent No.: US 10,925,148 B2
(45) Date of Patent: Feb. 16, 2021

(54) PRINTED CIRCUIT BOARD ASSEMBLY

(71) Applicant: SAMSUNG ELECTRONICS CO., LTD., Suwon-si (KR)

(72) Inventors: Seok-hun Kang, Suwon-si (KR); In-beom Kim, Suwon-si (KR); Bo-ram Kim, Suwon-si (KR); Soo-hong Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 15/664,369

(22) Filed: Jul. 31, 2017

(65) Prior Publication Data

US 2018/0042100 A1 Feb. 8, 2018

(30) Foreign Application Priority Data

Aug. 8, 2016 (KR) .................. 10-2016-0100589

(51) Int. Cl.
*H05K 1/00* (2006.01)
*H05K 1/02* (2006.01)
(Continued)

(52) U.S. Cl.
CPC .......... *H05K 1/0206* (2013.01); *H05K 1/00* (2013.01); *H05K 1/02* (2013.01); *H05K 1/0203* (2013.01);
(Continued)

(58) Field of Classification Search
CPC .......... H05K 1/00; H05K 1/0206; H05K 1/02; H05K 1/18; H05K 1/181; H05K 7/20
(Continued)

(56) References Cited

U.S. PATENT DOCUMENTS

| 4,755,417 A | * | 7/1988 | Detoma | H05K 1/0207 |
| | | | | 174/252 |
| 5,812,375 A | * | 9/1998 | Casperson | H05K 1/0204 |
| | | | | 165/80.3 |

(Continued)

FOREIGN PATENT DOCUMENTS

| JP | 56-61152 A | 5/1981 |
| JP | 2-192149 A | 7/1990 |

(Continued)

OTHER PUBLICATIONS

International Search Report dated Nov. 27, 2017 by the International Searching Authority in counterpart International Application No. PCT/KR2017/007796 (PCT/ISA/210).

(Continued)

*Primary Examiner* — Anatoly Vortman
*Assistant Examiner* — Zhengfu J Feng
(74) *Attorney, Agent, or Firm* — Sughrue Mion, PLLC

(57) ABSTRACT

A printed circuit board assembly is provided. A printed circuit board assembly includes a printed circuit board; an electronic component mounted on the printed circuit board; a heat radiating member which contacts the electronic component and is configured to receive and conduct heat generated by the electronic component; and at least one connection part connecting the printed circuit board and the heat radiating member to each other and configured to transfer the heat conducted through the heat radiating member to the printed circuit board.

18 Claims, 6 Drawing Sheets

(51) Int. Cl.
  *H05K 7/20* (2006.01)
  *H05K 1/18* (2006.01)
  *H05K 3/30* (2006.01)
  *H05K 3/42* (2006.01)
  *H05K 3/34* (2006.01)

(52) U.S. Cl.
  CPC .............. *H05K 1/18* (2013.01); *H05K 7/20* (2013.01); *H05K 7/20509* (2013.01); *H05K 1/181* (2013.01); *H05K 3/30* (2013.01); *H05K 3/3447* (2013.01); *H05K 3/429* (2013.01); *H05K 2201/066* (2013.01); *H05K 2201/1056* (2013.01); *Y02P 70/50* (2015.11)

(58) Field of Classification Search
  USPC .......................................................... 361/720
  See application file for complete search history.

(56) References Cited

U.S. PATENT DOCUMENTS

| | | | |
|---|---|---|---|
| 6,029,343 A | 2/2000 | Wieloch | |
| 6,188,578 B1* | 2/2001 | Lin | H01L 23/36 |
| | | | 165/185 |
| 6,191,478 B1* | 2/2001 | Chen | H01L 23/4093 |
| | | | 257/718 |
| 6,381,137 B1* | 4/2002 | Kato | H01L 23/3672 |
| | | | 165/185 |
| 7,057,276 B2 | 6/2006 | Lin et al. | |
| 7,554,191 B2 | 6/2009 | Inomata et al. | |
| 2005/0157469 A1 | 7/2005 | Gorak | |
| 2005/0180116 A1 | 8/2005 | Yamanaka | |
| 2006/0133043 A1* | 6/2006 | Boudreaux | H05K 1/144 |
| | | | 361/704 |
| 2007/0262427 A1 | 11/2007 | Koide | |
| 2008/0054450 A1 | 3/2008 | Chiu et al. | |
| 2008/0237817 A1* | 10/2008 | Pendse | H01L 23/40 |
| | | | 257/675 |
| 2012/0181067 A1 | 7/2012 | Wen et al. | |
| 2015/0257249 A1 | 9/2015 | Kim | |
| 2016/0205762 A1 | 7/2016 | Ritter et al. | |
| 2016/0286638 A1* | 9/2016 | Mitsui | G06F 1/20 |

FOREIGN PATENT DOCUMENTS

| | | |
|---|---|---|
| JP | 2001-160608 A | 6/2001 |
| JP | 2007-184351 A | 7/2007 |
| JP | 4593616 B2 | 12/2010 |
| KR | 10-2015-0002127 A | 1/2015 |
| KR | 10-1516615 B1 | 5/2015 |
| KR | 10-2016-0043050 A | 4/2016 |
| WO | 2010-126410 A1 | 11/2010 |

OTHER PUBLICATIONS

Written Opinion dated Nov. 27, 2017 by the International Searching Authority in counterpart International Application No. PCT/KR2017/007796 (PCT/ISA/237).

Communication dated May 15, 2019, issued by the European Patent Office in counterpart European Application No. 17839682.6.

Communication dated Oct. 29, 2020 issued by the European Patent Office in European Patent Application No. 17839682.6.

* cited by examiner

4

PRINTED CIRCUIT BOARD ASSEMBLY

CROSS-REFERENCE TO RELATED APPLICATION

This application claims priority from Korean Patent Application No. 10-2016-0100589, filed on Aug. 8, 2016 in the Korean Intellectual Property Office, the disclosure of which is incorporated herein by reference in its entirety.

BACKGROUND

Field

Apparatuses consistent with the present disclosure relate to a printed circuit board assembly having improved heat radiating performance.

Description of the Related Art

In general, various kinds of electronic devices may include a printed circuit board assembly including a printed circuit board (PCB) and a plurality of electronic components mounted on the PCB.

Among the electronic components mounted on the PCB, a electronic component in which a plurality of elements, such as a central processing unit (CPU) or an integrated circuit (IC), are integrated generates a lot of heat during operation, and the generated heat may cause malfunction in other components around the electronic component and the electronic device including other components.

In order to prevent overheating of the electronic component with significant heating, a heat sink made of a metal material having high thermal conductivity is in provided contact with a surface of the electronic component to induce heat radiation.

The heat sink cools the electronic component by convecting the heat generated from the electronic component to the air. A related art heat sink was able to increase receptible thermal capacity by enlarging a size to increase heat radiating performance, or to efficiently transfer the heat to the air by forming a large number of heat radiation fins to increase a contact area with external air.

In a case in which the related art heat sink is used, however, there is a disadvantage in that a recent tendency in which miniaturization, weight reduction, and thinness of the electronic device are required may not be achieved.

SUMMARY

Exemplary embodiments overcome the above disadvantages and other disadvantages not described above. Also, the present disclosure is not required to overcome the disadvantages described above, and an exemplary embodiment may not overcome any of the problems described above.

Exemplary embodiments provide a printed circuit board assembly having improved heat radiating performance along with miniaturization of a heat radiating member.

According to an aspect, a printed circuit board assembly includes a printed circuit board; an electronic component mounted on the printed circuit board; a heat radiating member which contacts the electronic component and is configured to receive and conduct heat generated by the electronic component; and at least one connection part connecting the printed circuit board and the heat radiating member to each other and configured to transfer the heat conducted through the heat radiating member to the printed circuit board.

According to another aspect, a printed circuit board assembly includes a printed circuit board including a ground layer; an electronic component mounted on a side of the printed circuit board; and a heat radiating member connected to the electronic component and configured to radiate heat conducted from the electronic component, wherein the heat radiating member comprises at least one connection part connected to the ground layer to conduct the heat conducted from the electronic component to the ground layer.

According to another aspect, a printed circuit board assembly includes a printed circuit board including a wiring pattern; an electronic component mounted on the wiring pattern of the printed circuit board; and a heat radiating member which contacts the electronic component, wherein the heat radiating member includes a plurality of connection parts connected to the printed circuit board to conduct heat conducted from the electronic component to the printed circuit board, and the plurality of connection parts are radially disposed around the electronic component without interfering with the wiring pattern.

BRIEF DESCRIPTION OF THE DRAWINGS

The above and/or other aspects will be more apparent by describing certain exemplary embodiments with reference to the accompanying drawings, in which.

DETAILED DESCRIPTION

Figure 1:
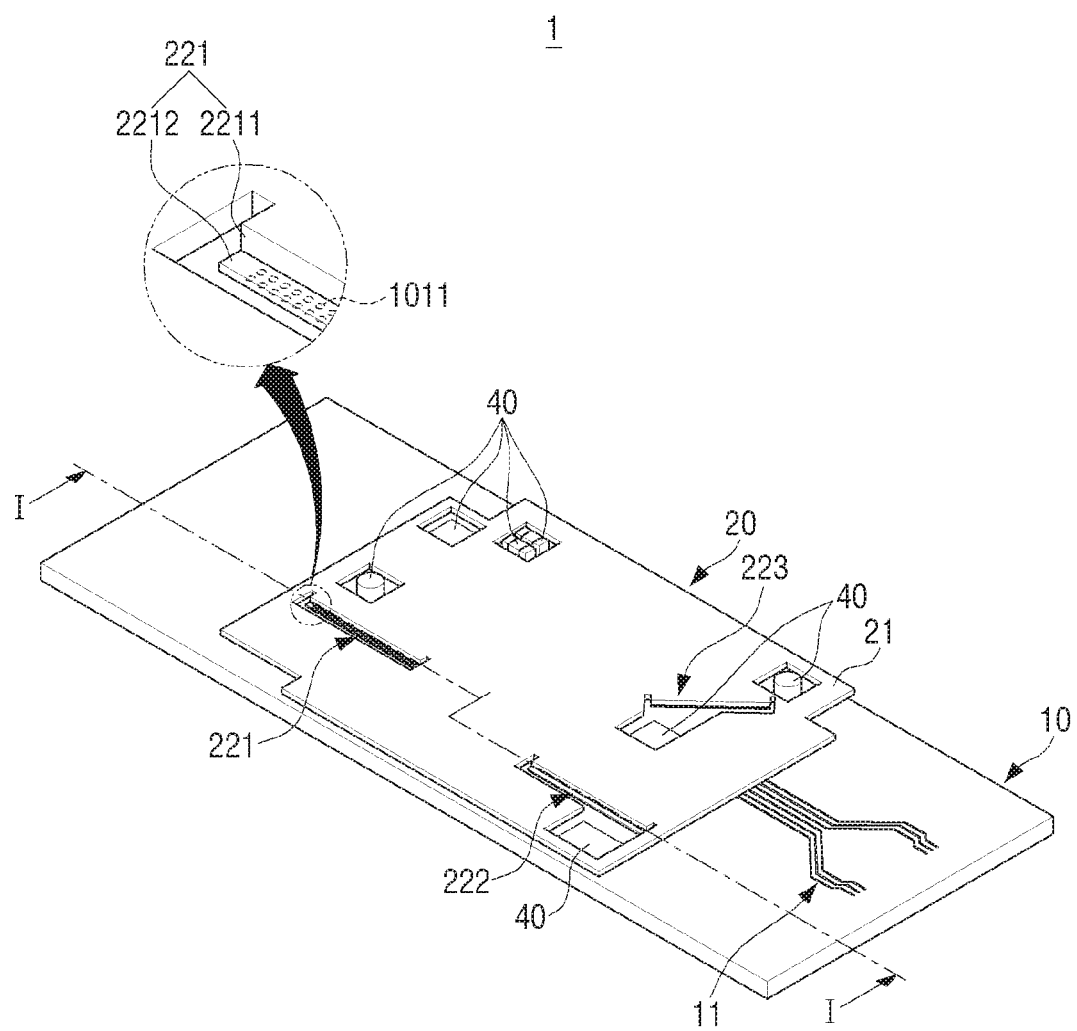
FIG. 1 is a perspective view of a printed circuit board assembly according to an exemplary embodiment.

Hereinafter, exemplary embodiments will be described in detail with reference to the accompanying drawings. The exemplary embodiments described below will be described based on exemplary embodiments which are most suitable for understanding technical characteristics of the present disclosure, and illustrate that the technical characteristics of the present disclosure are not limited by the exemplary embodiments described below, but the present disclosure may be implemented as in the exemplary embodiments described below.

Therefore, the present disclosure may be variously modified within a technical scope of the present disclosure through the exemplary embodiments described below, and the modified exemplary embodiments fall within the technical scope of the present disclosure. In addition, in order to help understand the exemplary embodiments described below, in regard to reference numerals indicated on the accompanying drawings, the related components of components that perform the same operation in the respective exemplary embodiments are indicated by the same or extension numeral.

Figure 2:
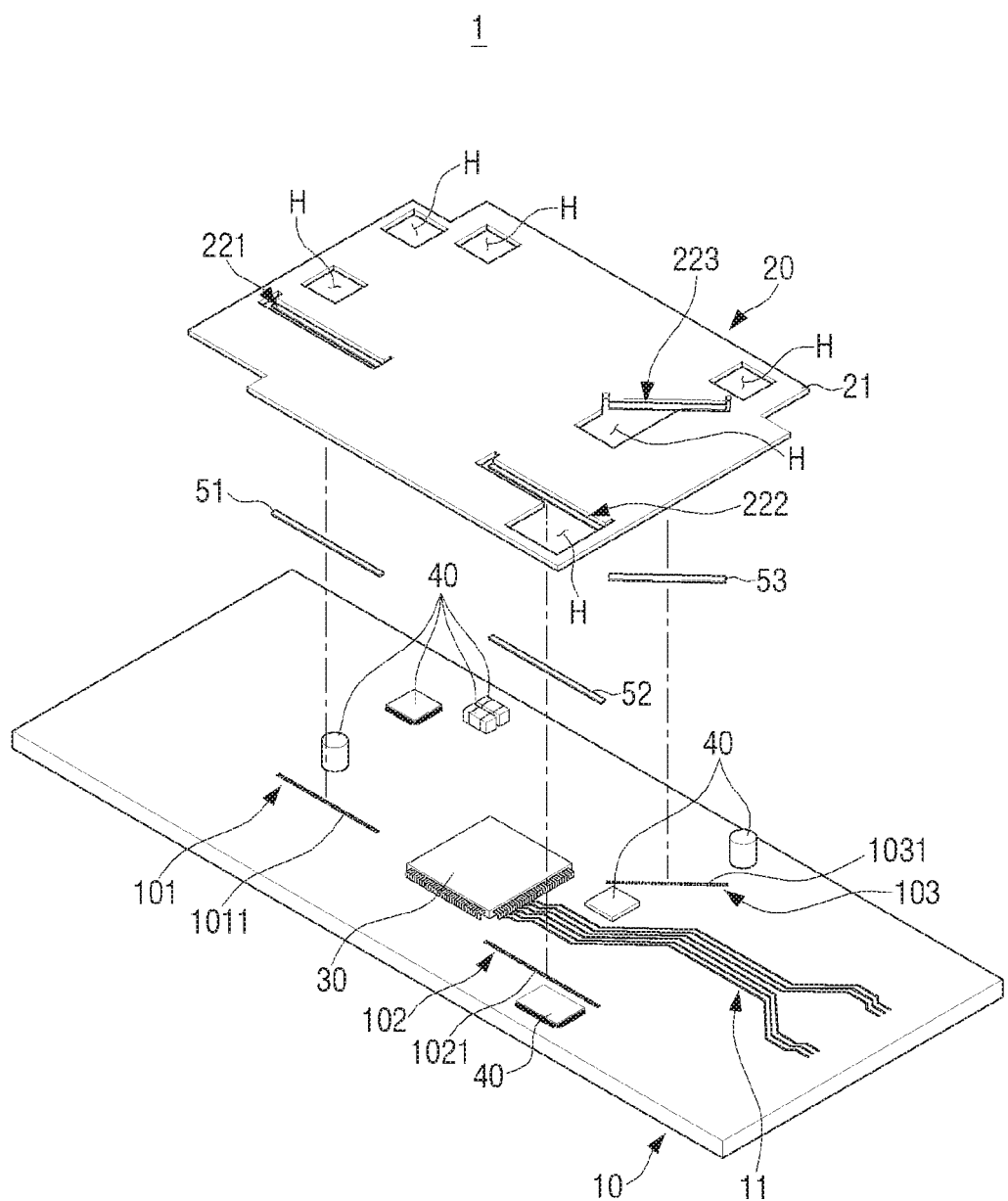
FIG. 2 is an exploded perspective view of the printed circuit board assembly illustrated in FIG. 1.

FIG. 1 is a perspective view of a printed circuit board assembly 1 according to an exemplary embodiment, and FIG. 2 is an exploded perspective view in which a printed circuit board 10 and a heat radiating member 20 of the printed circuit board assembly 1 illustrated in FIG. 1 are separated.

In FIGS. 1 and 2, the heat radiating member 20 is mainly illustrated for convenience of explanation, and other components are schematically illustrated.

The printed circuit board assembly 1 according to an exemplary embodiment may include the printed circuit board 10, the heat radiating member 20, and an electronic component 30 which generates heat during operation thereof.

The printed circuit board assembly 1 may be applied to various electronic devices such as, for example, a television (TV), a smartphone, a personal computer (PC), a notebook PC, a digital broadcasting terminal, a camera, a personal digital assistant (PDA), a washing machine, a dish washer, a refrigerator, and the like.

The printed circuit board 10 may have a flat plate (planar) form so that the electronic component 30 may be mounted thereon, and may be formed in various forms and sizes, as needed. Further, the printed circuit board 10 may be a rigid printed circuit board (PCB) or a flexible PCB. In addition, the printed circuit board 10 may be a single-sided PCB or a double-sided PCB, and may be a multilayer PCB.

The electronic component 30 may be mounted on a surface of the printed circuit board 10 as illustrated in FIG. 1, and in addition to this, a large number of electronic components and a large number of elements 40 may be mounted on the surface of the printed circuit board 10 by a surface mounting method and/or an insertion mounting method.

Hereinafter, for convenience of explanation, the electronic component 30 will be described, for example, as a heat-generating electronic component 30 that generates a large amount of heat during the operation such as a central processing unit (CPU) or an integrated circuit (IC) among various electronic components which may be mounted on the printed circuit board 10, and the various electronic components which may be mounted on the printed circuit board 10 other than the electronic component 30 as a heat source will be collectively referred to as a plurality of elements 40.

The electronic component 30 and the plurality of elements 40 that are mounted on the printed circuit board 10 illustrated in FIGS. 1 and 2 are illustrative and the present disclosure is not limited thereto, and the number of electronic component and elements mounted on the printed circuit board 10 and an arrangement thereof may be variously modified.

In addition, the plurality of elements 40 may include various kinds of active elements and/or passive elements.

Further, the electronic component 30 and the plurality of elements 40 may be mounted on the printed circuit board 10 using methods such as a ball grid array (BGA) method, a pin grid array (PGA) method, a tape carrier package (TCP) method, a chip-on-board (COB) method, a quad flat package (QFP) method, a quad flat non-leaded (QFN) method, and the like.

The printed circuit board 10 may include a wiring pattern 11 printed on a surface thereof so that the electronic component 30 and the plurality of elements 40 which are mounted thereon are electrically connected to each other.

An electrical circuit of the printed circuit board 10 may be formed through the wiring pattern 11, and the formation of the electrical circuit through the wiring pattern 11 may be performed through processes such as pre-processing, exposure, etching, delaminating, and the like.

Although FIGS. 1 and 2 schematically illustrate only a portion of the wiring pattern 11 for convenience of explanation, the wiring pattern 11 may be configured in various forms on the printed circuit board 10, and when the printed circuit board is a double-sided printed circuit board or a multilayer printed circuit board, the wiring pattern may be included in a plurality of layers included in the printed circuit board.

The heat radiating member 20 may be disposed on one side of the printed circuit board 10. For example, the heat radiating member 20 may be disposed on a side of the printed circuit board 10 on which the electronic component 30 is mounted.

The heat radiating member 20 according to an exemplary embodiment may have a flat plate form that may cover a portion of one side of the printed circuit board 10 on which the electronic component 30 is mounted. In addition, the heat radiating member 20 may be formed in various forms and sizes, as needed, and may be a configuration that covers the entirety of the printed circuit board 10.

Although FIGS. 1 and 2 illustrate, for example, the case in which the electronic component 30 and the plurality of elements 40 are mounted on a top surface of the printed circuit board 10, and the heat radiating member 20 covering a portion of the printed circuit board 10 is disposed on the electronic component 30, the arrangement and the shape of the heat radiating member 20 may also variously modified depending on the arrangement of the electronic component 30 mounted on the printed circuit board 10.

A bottom surface of the heat radiating member 20 is in surface-contact with the top surface of the electronic component 30, such that the heat radiating member 20 receives the heat generated from the electronic component 30 according to an operation of the electronic component 30 to discharge the heat to the outside. As a result, the electronic component 30 may radiate the heat through the heat radiating member 20, thereby obtaining a cooling effect. In addition, other components disposed around the electronic component 30 and an electronic device including other components may be protected from a malfunction caused by the heat of the electronic component 30 through the heat radiating operation of the heat radiating member 20.

To this end, the heat radiating member 20 may be formed of a material having high thermal conductivity, and may be, for example, formed of a metal such as aluminum, copper, silver, lead, or the like.

The heat radiating member 20 may be disposed on the electronic component 30 mounted on the printed circuit board 10 in a state in which the heat radiating member 20 is in surface-contact with the electronic component 30. In this case, a central portion of the heat radiating member 20 may be disposed at a position corresponding to the electronic component 30 so that the heat transferred from the electronic component 30 may be efficiently emitted to the outside (air or a ground pattern formed on the PCB) as the heat is spread from the central portion of the heat radiating member 20 to a peripheral portion thereof.

The heat generated from the electronic component 30 may be transferred to the heat radiating member 20, and the heat transferred to the heat radiating member 20 may be spread along the peripheral portion of the heat radiating member 20 from the central portion thereof to be discharged to the outside of the heat radiating member 20.

Further, a thermal interface material (TIM) may be disposed between the heat radiating member 20 and a bonding part of the electronic component 30, and conduction efficiency of the heat conducted to the heat radiating member 20 from the electronic component 30 may be maximized through the thermal interface material (TIM).

The thermal interface material may be formed of a material having a high thermal conductivity, and may for example, include a polymer-metal complex material, a ceramic complex material, and a carbon based complex material.

More specifically, the thermal interface material (TIM) may be formed of a material that an epoxy and a carbon fiber filler are mixed, silicon nitride (Si3N4), an epoxy, and boron nitride (BN).

Further, the thermal interface material (TIM) may be distinguished into a grease type, a glue type, a pad type, and the like, depending on a form thereof.

In addition, the thermal interface material (TIM) may have flexibility or may be formed of a flexible material.

Depending on roughness of the surfaces of the heat radiating member 20 and the electronic component 30 that are in contact with each other, fine voids may be formed between the heat radiating member 20 and the electronic component 30. Since the thermal interface material (TIM) is configured to have flexibility and disposed between the heat radiating member 20 and the electronic component 30 to fill the voids, an area for transferring the heat may be increased, and consequently, the heat transfer from the electronic component 30 to the heat radiating member 20 may be more efficiently performed.

The heat conducted to the heat radiating member 20 may be spread within the heat radiating member 20. Since the heat spread within the heat radiating member 20 is convected to the outside through all regions of the heat radiating member 20, the heat generated from the electronic component 30 may be discharged to the outside of the printed circuit board assembly 1.

As illustrated in FIGS. 1 and 2, the heat radiating member 20 may include a heat radiating plate 21 having approximately a flat plate shape that may be connected to or in contact with the electronic component 30, and at least one connection part supporting the heat radiating plate 21.

Further, although the present exemplary embodiment illustrates a case in which the connection part is formed integrally with the heat radiating member 20, the connection part is not limited thereto, but may be coupled to the heat radiating plate 21 through a separate coupling part. The heat radiating plate 21 may have a flat plate shape, and the electronic component 30 may be disposed on the central portion of the heat radiating plate 21 so as to be in contact with the heat radiating plate 21, as described above.

The heat conducted to the heat radiating plate 21 may be spread within the heat radiating plate 21 in a direction away from the electronic component 30, and the spread heat may be effectively discharged to the outside over the entire area of the heat radiating plate 21 having the flat plate shape.

As illustrated in FIGS. 1 and 2, the heat radiating plate 21 may include a plurality of element holes H that penetrate through the heat radiating plate 21.

Various kinds of elements mounted on the printed circuit board 10 may have different sizes and heights, respectively, and some elements mounted around the electronic component 30 may also be configured to have heights higher than that of the electronic component 30.

The heat radiating plate 21 may be disposed to be higher than the component having the highest height among the electronic component 30 and the plurality of elements 40 which are mounted on the printed circuit board 10, and consequently, the heat radiating plate 21, and the electronic component 30 and the plurality of elements 40 which are mounted on the printed circuit board 10 are in contact with each other, thereby making it possible to prevent an occurrence of electrical short, or the like.

As illustrated in FIGS. 1 and 2, however, in a case in which the heat radiating plate 21 is disposed to be in contact with an upper portion of the electronic component 30, and the heights of some elements 40 are configured to be higher than the height of the electronic component 30, the heat radiating plate 21 may be in contact with or interfere with the elements 40 disposed below the heat radiating plate 21 and the electrical short may occur, which may cause malfunction in the operation of the plurality of elements 40.

Therefore, the heat radiating plate 21 disposed on the electronic component 30 may include the plurality of element holes H formed in the positions corresponding to the arrangements of some elements 40 which may interfere with the heat radiating plate 21.

For example, the elements 40 having the heights higher than the height of the electronic component 30 may be disposed in the plurality of element holes H, and consequently, the heat radiating plate 21 may be in contact with the electronic component 30 without interfering with the plurality of elements 40.

Further, it is possible to prevent the heat radiating plate 21 from being disposed on the elements susceptible to heat by disposing the elements susceptible to the heat on the positions of the printed circuit board 10 corresponding to the plurality of element holes H, and consequently, it is possible to prevent the element susceptible to the heat from being damaged by the heat transferred to the heat radiating plate 21.

Although FIGS. 1 and 2 illustrate the example in which the plurality of elements 40 are disposed in the plurality of element holes H, other elements may also be disposed in the plurality of element holes H or may be disposed below the heat radiating plate 21.

The connection part supporting the heat radiating plate 21 may include a plurality of connection parts, i.e., a first connection part 221, a second connection part 222, and a third connection part 223. The number of connection parts may be one or more in consideration of the size or heat radiating performance of the heat radiating plate 21.

Further, the heat radiating plate 21 and the first connection part 221, the second connection part 222, and the third connection part 223 may be formed integrally with each other. For example, the connection parts may be formed through a plate work of partially blanking the positions in which the first connection part 221, the second connection part 222, and the third connection part 223 are to be formed on the heat radiating plate 21 and then multi-bending the blanked portions.

The first connection part 221, the second connection part 222, and the third connection part 223 may be disposed at the peripheral portion of the heat radiating plate 21 outside of the center of the heat radiating plate 21 to support the heat radiating plate 21 on the printed circuit board 10.

Figure 3:
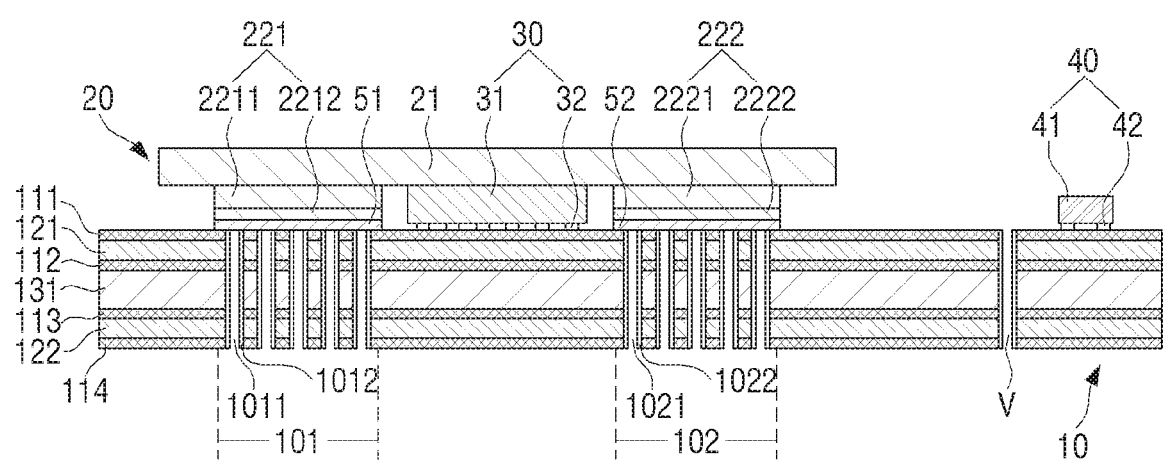
FIG. 3 is a cross-sectional view schematically illustrating a cross section taken along the line I-I of the printed circuit board assembly illustrated in FIG. 1.

Specifically, the first connection part 221, the second connection part 222, and the third connection part 223 may include a first supporting part 2211, a second supporting part 2221, and a third supporting part (not shown), respectively, that support the heat radiating plate 21, and a first contact part 2212, a second contact part 2222, and a third contact part (not shown), respectively, that are bent from the first supporting part 2211, the second supporting part 2221, and the third supporting part, respectively, as illustrated in FIG. 3.

In addition, the first supporting part 2211, the second supporting part 2221, and the third supporting part, and the first contact part 2212, the second contact part 2222, and the third contact part may be disposed in the positions in which the above-mentioned plurality of element holes H are formed.

Consequently, the heat radiating member 20 in which the heat radiating plate 21, the first connection part 221, the second connection part 222, and the third connection part 223 are formed integrally with each other may be easily manufactured by blanking the element holes H in the heat radiating plate 21 having the flat plate shape and bending some of the heat radiating plate 21 configuring a boundary of the element holes H to the first supporting part 2211, the second supporting part 2221, and the third supporting part, and the first contact part 2212, the second contact part 2222, and the third contact part.

In a case in which the first connection part 221, the second connection part 222, and the third connection part 223 are not manufactured integrally with the heat radiating plate 21, but are configured as separate members, the first connection part 221, the second connection part 222, and the third connection part 223 may be formed of a metal having high thermal conductivity similarly to the heat radiating plate 21. In this case, the respective connection parts may be coupled to the heat radiating plate 21 through a coupling part (e.g., a screw, a rivet, or welding), and in this case, the coupling part may also be formed of the metal having high thermal conductivity similarly to the heat radiating plate 21.

Further, as illustrated in FIG. 2, the heat radiating member 20 may be in contact with or coupled to a first contact surface 101, a second surface 102, and a third contact surface 103 on the printed circuit board 10 through the first contact part 2212, the second contact part 2222, and the third contact part, respectively.

The first contact part 2212, the second contact part 2222, and the third contact part may have a large area so as to maximize contact areas with the first contact surface 101, the second contact surface 102, and the third contact surface 103, respectively.

Further, the first supporting part 2211, the second supporting part 2221, and the third supporting part may also be directly in contact with the first contact surface 101, the second contact surface 102, and the third contact surface 103, respectively, without the first contact part 2212, the second contact part 2222, and the third contact part.

Consequently, the heat conducted to the heat radiating plate 21 may be transferred to the printed circuit board 10 through the first contact surface 101, the second contact surface 102, and the third contact surface 103 connected to the first connection part 221, the second connection part 222, and the third connection part 223, respectively.

Therefore, the heat conducted to the heat radiating plate 21 from the electronic component 30 may pass through the first supporting part 2211, the second supporting part 2221, and the third supporting part and may be transferred to the first contact surface 101, the second contact surface 102, and the third contact surface 103 through the first contact part 2212, the second contact part 2222, and the third contact part, respectively, and the heat transferred to the first contact surface 101, the second contact surface 102, and the third contact surface 103 may be spread through the printed circuit board 10, thereby making it possible to improve heat radiating performance of the printed circuit board assembly 1.

As illustrated in FIGS. 1 and 2, the first contact surface 101, the second contact surface 102, and the third contact surface 103 may be disposed radially around the electronic component 30 that generates the heat, and correspondingly, the first connection part 221, the second connection part 222, and the third connection part 223 may also be disposed radially around the central portion of the heat radiating plate 21 on which the electronic component 30 is disposed.

The heat conducted to the central portion of the heat radiating plate 21, that is, the heat transferred to the first contact surface 101, the second contact surface 102, and the third contact surface 103 may be easily spread into an entire region of the printed circuit board 10 by the radial array of the connection parts as described above.

In addition, the first contact surface 101, the second contact surface 102, and the third contact surface 103 may be formed in consideration of the arrangement of the plurality of elements 40 mounted on the printed circuit board 10 so that the first connection part 221, the second connection part 222, and the third connection part 223 may be easily coupled to the first contact surface 101, the second contact surface 102, and the third contact surface 103, respectively.

Specifically, the first contact surface 101, the second contact surface 102, and the third contact surface 103 may be disposed on the printed circuit board 10 without interfering with the electronic component 30 and the plurality of elements 40, and may also be disposed on the printed circuit board 10 without interfering with the wiring pattern 11.

To this end, as illustrated in FIG. 2, the first contact surface 101, the second contact surface 102, and the third contact surface 103 may be radially disposed around the electronic component 30 and may have an elongated shape which is extended in a direction away from the electronic component 30.

Therefore, the first contact part 2212, the second contact part 2222, and the third contact part which are in contact with the first contact surface 101, the second contact surface 102, and the third contact surface 103 may also be elongated in the direction away from the electronic component 30 corresponding to the shape of the first contact surface 101, the second contact surface 102, and the third contact surface 103.

Consequently, the heat transfer from the first contact part 2212, the second contact part 2222, and the third contact part to the first contact surface 101, the second contact surface 102, and the third contact surface 103, respectively, may be facilitated.

Further, the first contact surface 101, the second contact surface 102, and the third contact surface 103 may be radially disposed around the electronic component 30, and may have various shapes which do not interfere with the wiring pattern 11.

A plurality of via holes 1011, 1021, and 1031 that penetrate through the printed circuit board 10 may be respectively provided in the first contact surface 101, the second contact surface 102, and the third contact surface 103 of the printed circuit board 10.

As illustrated in FIG. 2, since the first contact surface 101, the second contact surface 102, and the third contact surface 103 have shapes that are elongated or extend in directions away from the electronic component 30, the plurality of via holes 1011, 1021, and 1031 provided in the first contact surface 101, the second contact surface 102, and the third contact surface 103 may also be disposed in the direction away from the electronic component 30.

Consequently, the heat of the heat radiating plate 21 may be transferred to the plurality of via holes 1011, 1021, and 1031 from the first connection part 221, the second connection part 222, and the third connection part 223 connected to the first contact surface 101, the second contact surface 102, and the third contact surface 103, respectively.

In addition, the plurality of via holes 1011, 1021, and 1031 are extended in directions away from the electronic component 30, thereby making it possible to more efficiently transfer the heat of the heat radiating plate 21 to the plurality of via holes 1011, 1021, and 1031.

A heat radiating structure through the plurality of via holes 1011, 1021, and 1031 will be described in detail below with reference to FIG. 3.

A first thermal interface material 51, a second thermal interface material 52, and a third thermal interface material 53 may be respectively disposed between the first contact surface 101, the second contact surface 102, and the third contact surface 103 and the first contact part 2212, the second contact part 2222, and the third contact part.

Since the first thermal interface material 51, the second thermal interface material 52, and the third thermal interface material 53 may be the same as or similar to the above-mentioned thermal interface material disposed between the heat radiating member 20 and the electronic component 30, an overlapped description will be omitted.

The first thermal interface material 51, the second thermal interface material 52, and the third thermal interface material 53 formed of a material having high thermal conductivity may respectively fill voids between the first contact surface 101, the second contact surface 102, and the third contact surface 103 and the first contact part 2212, the second contact part 2222, and the third contact part.

Therefore, an effect of the heat transfer from the first connection part 221, the second connection part 222, and the third connection part 223 to the first contact surface 101, the second contact surface 102, and the third contact surface 103 may be further increased through the first thermal interface material 51, the second thermal interface material 52, and the third thermal interface material 53.

The first thermal interface material 51, the second thermal interface material 52, and the third thermal interface material 53 illustrated in FIG. 2 are shown as a pad type having shapes respectively corresponding to the shapes of the first contact surface 101, the second contact surface 102, and the third contact surface 103 and the first contact part 2212, the second contact part 2222, and the third contact part, but the first thermal interface material 51, the second thermal interface material 52, and the third thermal interface material 53 may be respectively coated between the first contact surface 101, the second contact surface 102, and the third contact surface 103 and the first contact part 2212, the second contact part 2222, and the third contact part as a grease type or a glue type.

FIG. 3 is a cross-sectional view schematically illustrating a cross section taken along the line I-I of the printed circuit board assembly 1 illustrated in FIG. 1.

Hereinafter, a heat radiating structure through the electronic component 30 that generates heat, the heat radiating member 20 coupled to the electronic component 30, and the printed circuit board 10 connected to the heat radiating member 20 will be described in more detail with reference to FIGS. 1 to 3.

The printed circuit board 10 illustrated in FIG. 3 is illustrated, for example, as a multilayer printed circuit board including a first layer 111, a second layer 112, a third layer 113, a fourth layer 114, a first insulating layer 121, a second insulating layer 122, and a core layer 131.

As illustrated in FIG. 3, the printed circuit board 10 may include the first layer 111 on which the electronic component 30 and the elements 40 are mounted, and the second layer 112, the third layer 113 and the fourth layer 114 which are sequentially stacked below the first layer 111, the first insulating layer 121 may be disposed between the first layer 111 and the second layer 112, the core layer 131 may be disposed between the second layer 112 and the third layer 113, and the second insulating layer 122 may be disposed between the third layer 113 and the fourth layer 114.

The first layer 111, the second layer 112, the third layer 113 and the fourth layer 114 may be formed of a conductive copper foil, and consequently, a circuit layer may be configured.

Further, the first insulating layer 121, the second insulating layer 122, and the core layer 131 may be formed of an insulative material, and consequently, the first layer 111, the second layer 112, the third layer 113 and the fourth layer 114 may be insulated from each other.

The electronic component 30 and the plurality of elements 40 may be mounted on the first layer 111 of the printed circuit board 10, on which an electrical signal line such as the wiring pattern 11 may be disposed.

The electronic component 30 may include an electronic component body 31 and a plurality of connectors 32, and may be mounted on the first layer 111 through the plurality of connectors 32.

Further, the plurality of elements 40 may also include an element body 41 and a plurality of connectors 42, and may be mounted on the first layer 111 through the plurality of connectors 42.

The plurality of connectors 32 of the electronic component 30 and the plurality of connectors 42 of the elements 40 may include solder bumps or solder balls.

The second layer 112 may be a ground layer formed of a conductive metal covering an entire area of the printed circuit board 10.

Consequently, the second layer 112 prevents the electrical signals applied to the first layer 111, the third layer 113, and the fourth layer 114 from being affected by peripheral devices, thereby making it possible to maintain signal quality.

Further, the third layer 113 may be a power layer including a power wiring that supplies power to the printed circuit board 10, and the fourth layer 114, which is a structure similar to the first layer 111, may have an electrical signal line disposed thereon.

In addition, a plurality of electronic components and a plurality of elements may be mounted on the electrical signal line of the fourth layer 114, and a heat radiating member may be additionally disposed on the fourth layer 114, thereby making it possible to additionally radiate heat generated from the electronic component that generates the heat, mounted on the fourth layer 114.

A configuration of the printed circuit board 10 configured in a multilayer of the first layer 111, the second layer 112, the third layer 113 and the fourth layer 114 illustrated in FIG. 3 is illustrative, and may be variously modified, as needed.

The first contact surface 101, the second contact surface 102, and the third contact surface 103 which may be connected to the first connection part 221, the second connection part 222, and the third connection part 223 of the heat radiating member 20 may be radially disposed on the first layer 111 of the printed circuit board 10.

The plurality of via holes 1011, 1021, and 1031 may be disposed in the first contact surface 101, the second contact surface 102, and the third contact surface 103 in the direction away from the electronic component 30.

In addition, as illustrated in FIG. 3, other via holes V electrically connecting between a plurality of layers may be further included in the printed circuit board 10 rather than the plurality of via holes 1011, 1021, and 1031 disposed in the first contact surface 101, the second contact surface 102, and the third contact surface 103.

FIG. 3 illustrates only a plurality of via holes 1011 disposed in the first contact surface 101 and a plurality of via holes 1021 provided in the second contact surface 102, and a plurality of via holes 1031 (FIG. 2) provided in the third contact surface 103 may be the same configuration of the plurality of via holes 1011 and 1021 provided in the first contact surface 101 and the second contact surface 102.

As described above, the plurality of via holes 1011, 1021, and 1031 provided in the first contact surface 101, the second contact surface 102, and the third contact surface 103 may be disposed in the direction away from the central portion of the printed circuit board 10 on which the electronic component 30 is mounted.

Since the plurality of via holes 1011, 1021, and 1031 penetrate through the printed circuit board 10, the plurality of via holes 1011, 1021, and 1031 may penetrate through the first to fourth layers 111, 112, 113, and 114.

The plurality of via holes 1011, 1021, and 1031 may be covered or plated with a conductive material.

Specifically, the plurality of via holes 1011, 1021, and 1031 may include inner circumference surfaces plated with the conductive material. For example, the via holes 1011 and 1021 may include inner circumference surfaces 1012 and 1022, respectively, as shown in FIG. 3. Consequently, the first to fourth layers 111, 112, 113, and 114 may be electrically connected to each other through the plurality of via holes 1011, 1021, and 1031.

In addition, the inner circumference surfaces of the plurality of via holes 1011, 1021, and 1031 may be covered or plated with a material having high thermal conductivity.

For example, the inner circumference surfaces of the plurality of via holes 1011, 1021, and 1031 may be covered with a metal such as aluminum, copper, or the like, and may be formed of the same material as the heat radiating member 20.

Consequently, heat transferred to the plurality of via holes 1011, 1021, and 1031 may be spread into the printed circuit board 10 along the inner circumference surfaces.

A detailed process in which the heat generated from the electronic component 30 is spread through the heat radiating member 20 is as follows.

The heat generated through the electronic component 30 may be conducted to the heat radiating plate 21 coupled to the electronic component 30, and the heat conducted to the heat radiating plate 21 may be outwardly spread from the central portion of the heat radiating plate 21.

The heat spread through the inside of the heat radiating plate 21 may be convected to an upper portion of the heat radiating plate 21 to be discharged to the outside.

Further, the heat radiating plate 21 may include a plurality of heat radiating fins which outwardly protrude, and a heat exchange area with the outside is increased through the plurality of heat radiating fins, thereby making it possible to further increase the effect of the heat transfer to the outside.

Further, a portion of the heat conducted to the heat radiating plate 21 may be transferred to the first connection part 221, the second connection part 222, and the third connection part 223.

The heat transferred to the first connection part 221, the second connection part 222, and the third connection part 223 may be transferred to the first contact part 2212, the second contact part 2222, and the third contact part through the first supporting part 2211, the second supporting part 2221, and the third supporting part, respectively.

Thereafter, the heat may be transferred to the first contact surface 101, the second contact surface 102, and the third contact surface 103 from the first contact part 2212, the second contact part 2222, and the third contact part, respectively, and consequently, and the heat of the heat radiating member 20 may be transferred to the printed circuit board 10.

In general, most of the heat transferred to the heat radiating member 20 from the electronic component 30 may be discharged through the heat radiating plate 21 formed in the flat plate shape so that the heat exchange with the outside is easily performed.

However, since the heat is continuously generated from the electronic component 30, the heat radiating performance through the heat radiating member 20 may be degraded when the heat in the heat radiating member 20 is saturated.

In this case, the heat radiating performance of the entirety of the printed circuit board assembly 1 may be maintained by spreading the saturated heat of the heat radiating member 20 to the printed circuit board 10 through the first connection part 221, the second connection part 222, and the third connection part 223 and the first contact surface 101, the second contact surface 102, and the third contact surface 103.

As described above, the heat transfer to the first contact surface 101, the second contact surface 102, and the third contact surface 103 from the first contact part 2212, the second contact part 2222, and the third contact part may be more effectively performed through the first thermal interface material 51, the second thermal interface material 52, and the third thermal interface material 53.

The heat transferred to the first contact surface 101, the second contact surface 102, and the third contact surface 103 may be spread into the entire region of the printed circuit board 10 through the plurality of via holes 1011, 1021, and 1031 provided in the first contact surface 101, the second contact surface 102, and the third contact surface 103, respectively.

Specifically, the heat transferred to the first contact surface 101, the second contact surface 102, and the third contact surface 103 of the first layer 111 may be spread into the printed circuit board 10 through the plurality of via holes 1011, 1021, and 1031 of the first contact surface 101, the second contact surface 102, and the third contact surface 103.

The heat transferred to the first contact surface 101, the second contact surface 102, and the third contact surface 103 may be sequentially conducted to the first insulating layer 121, the second layer 112, the core layer 131, the third layer 113, the second insulating layer 122, and the fourth layer 114 from the first layer 111 through the inner circumference surfaces of the plurality of via holes 1011, 1021, and 1031.

Further, a portion of the heat transferred to the first contact surface 101, the second contact surface 102, and the third contact surface 103 may be convected through an inner space of the plurality of via holes 1011, 1021, and 1031 disposed in the first contact surface 101, the second contact surface 102, and the third contact surface 103 and be spread into the printed circuit board 10.

As described above, the second layer 112 configured as the ground layer that may cover the entire region of the printed circuit board 10 may be formed of a metal such as aluminum or copper having high thermal conductivity.

Therefore, the heat transferred to the second layer 112 through the plurality of via holes 1011, 1021, and 1031 may be more efficiently spread into the entire region of the printed circuit board 10 through the second layer 112 having high thermal conductivity, and consequently, the heat radiating performance of the printed circuit board assembly 1 may be improved.

Further, the thermal conductivity to the second layer 112 from the plurality of via holes 1011, 1021, and 1031 may be further increased by additionally disposing a thermal interface material between the inner circumference surfaces of the plurality of via holes 1011, 1021, and 1031 and the second layer 112.

In addition, since the plurality of elements 40 may also be connected to the second layer 112 covering the entire region of the printed circuit board 10, the heat spread through the second layer 112 may also be transferred to the plurality of elements 40 connected to the second layer 112.

Therefore, the heat transferred to the plurality of elements 40 may also be discharged to the outside through the plurality of elements 40 mounted on the surface of the printed circuit board 10.

Further, by connecting the elements having strong durability against the heat to the second layer 112 and separately connecting the elements susceptible to the heat to the third layer 113 or the fourth layer 114, additional heat radiating performance through the elements having the strong durability against the heat and connected to the second layer 112 may be secured.

In addition, since the heat transferred to the first contact surface 101, the second contact surface 102, and the third contact surface 103 may also be spread through the third layer 113, the fourth layer 114, the first insulating layer 121, the second insulating layer 122, and the core layer 131 which are connected to the plurality of via holes 1011, 1021, and 1031, the heat radiating performance of the printed circuit board assembly 1 may be improved.

Further, the plurality of via holes 1011, 1021, and 1031 provided in the first contact surface 101, the second contact surface 102, and the third contact surface 103 may be formed to penetrate through only some layers of the printed circuit board 10, rather than the entire printed circuit board 10.

Consequently, a plurality of layers configuring the printed circuit board 10 may be thermally separated as needed by configuring separate layers to which the heat is not transferred from the plurality of via holes 1011, 1021, and 1031 of the first contact surface 101, the second contact surface 102, and the third contact surface 103.

For example, the heat of the heat radiating member 20 may be additionally spread through the second layer 112 by providing the plurality of via holes 1011, 1021, and 1031 in the first contact surface 101, the second contact surface 102, and the third contact surface 103 to be connected up to the second layer 112 from the first layer 111, and third layer 113 and the fourth layer 114 may be configured so that the heat is not transferred from the heat radiating member 20.

Consequently, the components susceptible to the heat are centrally connected to each other on the third layer 113 and the fourth layer 114, thereby making it possible to prevent the components susceptible to the heat from being damaged by a heat radiation through the second layer 112.

Figure 4:
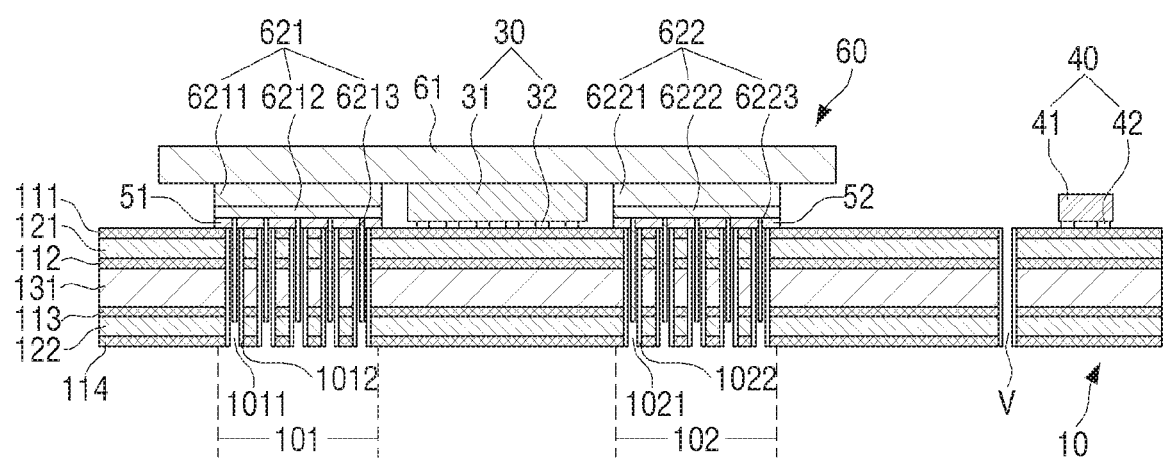
FIG. 4 is a cross-sectional view schematically illustrating a cross section of a printed circuit board assembly according to another exemplary embodiment.

FIG. 4 is a cross-sectional view schematically illustrating a cross section of a printed circuit board assembly 2 according to another exemplary embodiment.

The printed circuit board assembly 2 according to another exemplary embodiment may include the printed circuit board 10, a heat radiating member 60, the electronic component 30 which generates a large amount of heat during operation thereof, and the plurality of elements 40.

Since the printed circuit board 10, the electronic component 30, and the plurality of elements 40 are the same as the configurations of the printed circuit board assembly 1 according to the exemplary embodiment described above, repeated description thereof will be omitted.

As illustrated in FIG. 4, the heat radiating member 60 may include a heat radiating plate 61 and at least one connection part coupled to the heat radiating plate 61 to support the heat radiating plate 61.

The connection part supporting the heat radiating plate 61 may include a plurality of connection parts, for example, a first connection part 621, a second connection part 622, and a third connection part.

Although FIG. 4 does not illustrate the third connection part, a configuration of the third connection part is the same as the first connection part 621 and the second connection part 622.

The first connection part 621, the second connection part 622, and the third connection part may be disposed at one side of the heat radiating plate 61 to support the heat radiating plate 61 on the printed circuit board 10.

Specifically, the first connection part 621, the second connection part 622, and the third connection part may include a first supporting part 6211, a second supporting part 6221, and a third supporting part (not shown) that support the heat radiating plate 61, and a first contact part 6212, a second contact part 6222, and a third contact part (not shown) that are bent from the first supporting part 6211, the second supporting part 6221 and the third supporting part.

Although FIG. 4 does not illustrate the third supporting part, a configuration of the third supporting part is the same as the first supporting part 6211 and the second supporting part 6221. Further, although FIG. 4 does not illustrate the third contact part, a configuration of the third contact part is the same as the first contact part 6212 and the second connection parts 6222.

Further, the first connection part 621, the second connection part 622, and the third connection part may include a plurality of connection pins 6213, 6223, and 6233 coupled to the first contact part 6212, the second contact part 6222, and the third contact part.

The plurality of connection pins 6213, 6223, and 6233 are structures that protrude from the first to third contact parts 6212, 6222, and 6232, and lengths of the plurality of connection pins 6213, 6223, and 6233 may be formed to correspond to lengths of the plurality of via holes 1011, 1021, and 1031 of the first contact surface 101, the second contact surface 102, and the third contact surface 103.

Consequently, the plurality of connection pins 6213, 6223, and 6233 may be inserted into the plurality of via holes 1011, 1021, and 1031 provided in the first contact surface 101, the second contact surface 102, and the third contact surface 103.

The plurality of connection pins 6213, 6223, and 6233 may be configured to have the same number as the plurality of via holes 1011, 1021, and 1031 of the first contact surface 101, the second contact surface 102, and the third contact surface 103, and may be disposed to correspond to the arrangement of the plurality of via holes 1011, 1021, and 1013.

The plurality of connection pins 6213, 6223, and 6233 are inserted into the plurality of via holes 1011, 1021, and 1031 of the first contact surface 101, the second contact surface 102, and the third contact surface 103, thereby making it possible to more firmly couple the heat radiating member 60 to the first contact surface 101, the second contact surface 102, and the third contact surface 103.

Further, the plurality of connection pins 6213, 6223, and 6233 may be formed of a metal such as aluminum, copper, or silver having high thermal conductivity.

Therefore, the heat may be easily conducted to the plurality of connection pins 6213, 6223, and 6233 from the first contact part 6212, the second contact part 6222, and the third contact part.

In addition, the plurality of connection pins 6213, 6223, and 6233 are inserted into the plurality of via holes 1011, 1021, and 1031 of the first contact surface 101, the second contact surface 102, and the third contact surface 103, thereby making it possible to more effectively transfer the heat to the plurality of via holes 1011, 1021, and 1031.

The first thermal interface material 51, the second thermal interface material 52, and the third thermal interface material 53 may be formed of a flexible material, and the plurality of connection pins 6213, 6223, and 6233 may penetrate through the first thermal interface material 51, the second thermal interface material 52, and the third thermal interface material 53.

Further, a thermal interface material may be additionally filled in the plurality of via holes 1011, 1021, and 1031 into which the plurality of connection pins 6213, 6223, and 6233 are inserted, thereby making it possible to further increase thermal conductivity from the plurality of connection pins 6213, 6223, and 6233 to the plurality of via holes 1011, 1021, and 1031.

As such, since the plurality of connection pins 6213, 6223, and 6233 of the heat radiating member 60 according to another exemplary embodiment are directly inserted into the plurality of via holes 1011, 1021, and 1031 of the first contact surface 101, the second contact surface 102, and the third contact surface 103, the heat of the heat radiating member 60 may be more effectively spread into the printed circuit board 10, and consequently, heat radiating performance of the printed circuit board assembly 2 may be improved.

Figure 5:
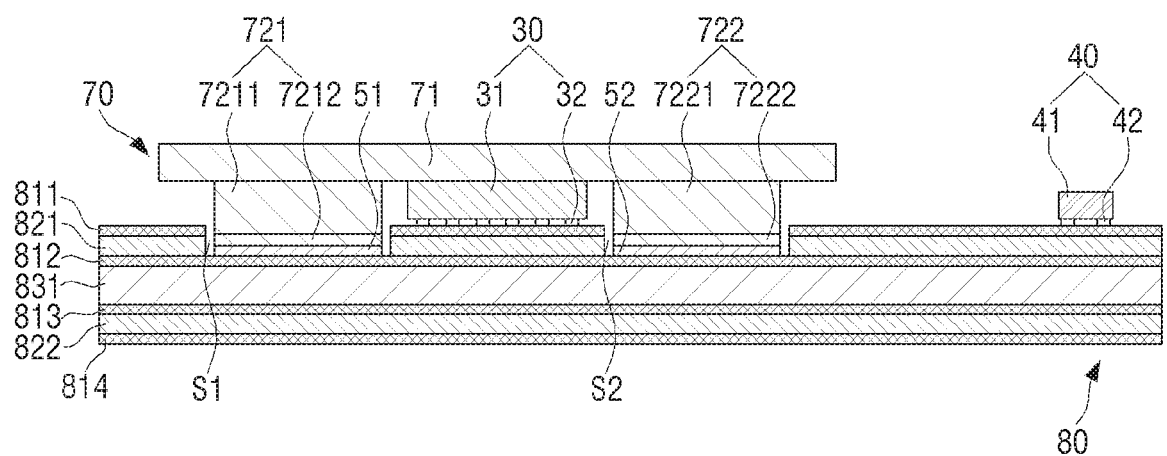
FIG. 5 is a cross-sectional view schematically illustrating a cross section of a printed circuit board assembly according to still another exemplary embodiment.

FIG. 5 is a cross-sectional view schematically illustrating a cross section of a printed circuit board assembly 3 according to still another exemplary embodiment.

The printed circuit board assembly 3 according to still another exemplary embodiment may include a heat radiating member 70, a printed circuit board 80, the electronic component 30 which generates a large amount of heat during operation thereof, and the plurality of elements 40.

Since the electronic component 30 and the plurality of elements 40 are the same as the configurations of the printed circuit board assembly 1 according to the exemplary embodiment described above, repeated description thereof will be omitted.

The heat radiating member 70 may include a heat radiating plate 71 and at least one connection part coupled to the heat radiating plate 71 to support the heat radiating plate 71.

The connection part supporting the heat radiating plate 71 may include a plurality of connection parts, for example, a first connection part 721, a second connection part 722, and a third connection part.

Although FIG. 5 does not illustrate the third connection part, a configuration of the third connection part is the same as that of the first connection part 721 and the second connection part 722.

The first connection part 721, the second connection part 722, and the third connection part may be disposed at one side of the heat radiating plate 71 to support the heat radiating plate 71 on the printed circuit board 80.

As illustrated in FIG. 5, the printed circuit board 80 may include a first layer 811 on which the electronic component 30 and the elements 40 are mounted, and a second layer 812, a third layer 813, and a fourth layer 814 which are sequentially stacked below the first layer 811, a first insulating layer 821 may be disposed between the first layer 811 and the second layer 812, a core layer 831 may be disposed between the second layer 812 and the third layer 813, and a second insulating layer 822 may be disposed between the third layer 813 and the fourth layer 814.

The first layer 811, the second layer 812, the third layer 813, and the fourth layer 814 may be formed of a conductive copper foil, and consequently, a circuit layer may be configured.

Further, the first insulating layer 821, the second insulating layer 822, and the core layer 831 may be formed of an insulative material, and consequently, the first layer 811, the second layer 812, the third layer 813, and the fourth layer 814 may be insulated from each other.

The printed circuit board 80 according to still another exemplary embodiment is a multilayer printed circuit board having the configuration similar to the printed circuit board 10 illustrated in FIGS. 3 and 4, where the electronic component 30 and the plurality of elements 40 may be mounted on the first layer 811, on which an electrical signal line such as the wiring pattern may be disposed.

In addition, the second layer 812 may be a ground layer formed of a conductive metal covering an entire region of the printed circuit board 80, the third layer 813 may be a power layer including a power wiring that supplies power to the printed circuit board 80, and the fourth layer 814, which is a structure similar to the first layer, may have the electrical signal line disposed thereon.

Further, the printed circuit board 80 may include a step part that recessed toward the second layer 812 from the first layer 811.

The step part may include a first step part S1, a second step part S2 and a third step part (not shown) provided at positions corresponding to the arrangement of the first connection part 721, the second connection part 722, and the third connection part of the heat radiating member 70.

The first step part S1, the second step part S2 and the third step part may be formed to be extended in the direction away from the electronic component 30, similarly to the first contact surface 101, the second contact surface 102, and the third contact surface 103 according to an exemplary embodiment described above, and may be radially disposed around the electronic component 30.

A portion of the second layer 812 may be directly exposed to the outside of the printed circuit board 80 through the first step part S1, the second step part S2 and the third step part.

Further, the first connection part 721, the second connection part 722, and the third connection part of the heat radiating member 70 may be directly in contact with the portion of the second layer 812 through the first step part S1, the second step part S2 and the third step part.

Specifically, the first connection part 721, the second connection part 722, and the third connection part may include a first supporting part 7211, a second supporting part

7221, and a third supporting part (not shown), respectively, that support the heat radiating plate 71, and first contact part 7212, the second contact part 7222, and the third contact part that are bent from the first supporting part 7211, the second supporting part 7221, and the third supporting part.

The first supporting part 7211, the second supporting part 7221, and the third supporting part may connect between the heat radiating plate 71 which is in contact with the electronic component 30 and the first contact part 7212, the second contact part 7222, and the third contact part which are in contact with the second layer 812, thereby making it possible to support the heat radiating plate 71 from the second layer 812.

The first contact part 7212, the second contact part 7222, and the third contact part may have shapes corresponding to those of the first to third step parts S1, S2, and S3.

Therefore, the first contact part 7212, the second contact part 7222, and the third contact part may be formed to be extended in the direction away from the electronic component 30, and may be radially disposed around the electronic component 30.

Further, the first thermal interface material 51, the second thermal interface material 52, and the third thermal interface material 53 may be respectively disposed between the first contact part 7212, the second contact part 7222, and the third contact part and the second layer 812 which is in contact with the first contact part 7212, the second contact part 7222, and the third contact part.

Consequently, the heat transfer from the first contact part 7212, the second contact part 7222, and the third contact part to the second layer 812 may be easily performed.

Therefore, the heat generated from the electronic component 30 may be conducted into the heat radiating plate 71 and may be spread through the interior of the heat radiating plate 71.

Further, a portion of the heat conducted to the heat radiating plate 71 may be transferred to the first connection part 721, the second connection part 722, and the third connection part, and may be transferred to the first contact part 7212, the second contact part 7222, and the third contact part coupled to the first connection part 721, the second connection part 722, and the third connection part, respectively.

The first contact part 7212, the second contact part 7222, and the third contact part may be directly connected to the second layer 812 through the first step part S1, the second step part S2, and the third step part, and heat of the first contact part 7212, the second contact part 7222, and the third contact part may be directly conducted to the second layer 812.

Further, the first thermal interface material 51, the second thermal interface material 52, and the third thermal interface material 53 fill voids between the first contact part 7212, the second contact part 7222, and the third contact part and the second layer 812, thereby making it possible to more efficiently transfer the heat of the heat radiating member 70 to the second layer 812.

In addition, the heat transferred to the second layer 812 may be transferred to the core layer 831, the third layer 813, the second insulating layer 822, and the fourth layer 814 through a plurality of via holes, and consequently, overall heat radiating performance of the printed circuit board assembly 3 may be improved.

Figure 6:
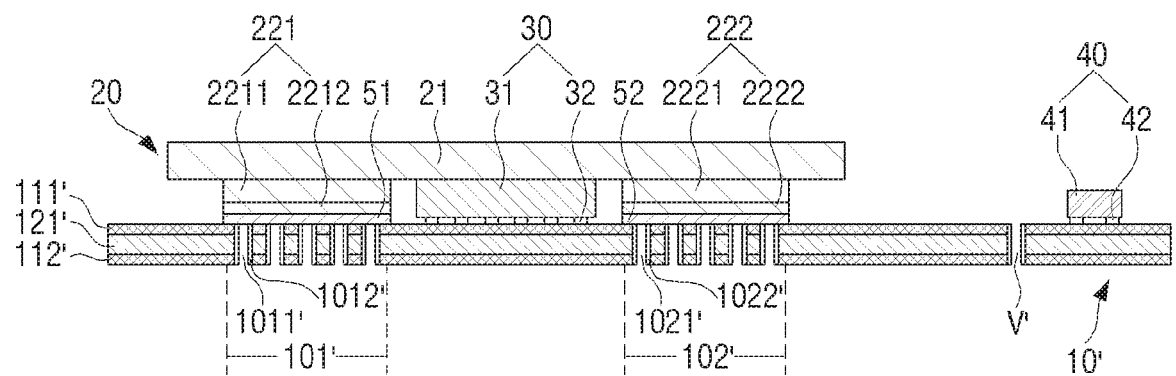
FIG. 6 is a cross-sectional view schematically illustrating a cross section of a printed circuit board assembly according to still another exemplary embodiment.

FIG. 6 is a cross-sectional view schematically illustrating a cross section of a printed circuit board assembly 4 according to still another exemplary embodiment.

The printed circuit board assembly 4 according to still another exemplary embodiment may include a printed circuit board 10', the heat radiating member 20, the electronic component 30 which generates heat during operation thereof, and the plurality of elements 40.

Since the heat radiating member 20, the electronic component 30, and the plurality of elements 40 are the same as the configurations of the printed circuit board assembly 1 according to an exemplary embodiment described above, an overlapped description will be omitted.

The printed circuit board 10' illustrated in FIG. 6 may include a first layer 111' on which the electronic component 30 and the plurality of elements 40 are mounted and the electrical signal line such as the wiring pattern 11 may be disposed, and a second layer 112' that may include the power layer and the ground layer.

Further, the printed circuit board 10' may include an insulating layer 121' disposed between the first layer 111' and the second layer 112' to insulate the first layer 111' and the second layer 112' from each other.

A first contact surface 101', a second contact surface 102', and a third contact surface (not shown) which may be connected to the first connection part 221, the second connection part 222, and the third connection part 223 of the heat radiating member 20 may be radially disposed on the first layer 111' of the printed circuit board 10'.

A plurality of via holes, for example, a via hole 1011' and a via hole 1021', disposed in a direction away from the electronic component 30 may be provided in the first contact surface 101', the second contact surface 102', and the third contact surface, and the plurality of via holes may include inner circumference surfaces, for example, inner circumference surfaces 1012' and 1022', covered with a material having high thermal conductivity.

Consequently, the heat transferred to the first contact surface 101', the second contact surface 102', and the third contact surface from the heat radiating member 20 may be transferred to the second layer 112' through the plurality of via holes 1011' and 1021', and the heat transferred to the second layer 112' may be discharged to the outside.

As illustrated in FIG. 6, one side of the printed circuit board 10' on which the electronic component 30 is mounted may convect the heat to an upper side of the printed circuit board 10' through the heat radiating plate 21 of the heat radiating member 20.

Further, the heat is transferred to the first to third contact surfaces 101', 102', and 103' from the first connection part 221, the second connection part 222, and the third connection part 223, and the heat transferred to the first contact surface 101', the second contact surface 102', and the third contact surface is transferred to the second layer 112', which is opposite to the first layer 111', through the plurality of via holes 1011' and 1021', thereby making it possible to discharge the heat to a lower side of the printed circuit board 10'.

As such, since the heat generated from the electronic component 30 may be discharged to the outside through both surfaces of the printed circuit board 10', heat radiating performance of the printed circuit board assembly 4 may be improved.

In addition, since the printed circuit board 10' according to the present exemplary embodiment is formed in a single layer unlike the printed circuit board 10 having the multi-layer structure illustrated in FIG. 3, a thickness of the printed circuit board 10' may be thinner, and the structure of the printed circuit board 10' may also be simplified.

Hereinabove, while various exemplary embodiments have been separately described, the respective exemplary embodiments are not necessarily solely implemented, and the configuration and the operation of the respective exemplary embodiments may also be implemented in combination with other exemplary embodiments.

Hereinabove, although the exemplary embodiments have been shown and described, it should be understood that the present disclosure is not limited to the disclosed embodiments and may be variously modified without departing from the spirit and the scope of the present disclosure.

What is claimed is:

1. A printed circuit board assembly comprising:
   a printed circuit board;
   an electronic component mounted on the printed circuit board;
   a heat radiating member which contacts the electronic component and is configured to receive and conduct heat generated by the electronic component;
   at least one connection part connecting the printed circuit board and the heat radiating member and configured to transfer the heat conducted through the heat radiating member to the printed circuit board, the at least one connection part being located at an internal portion of the heat radiating member, the at least one connection part being inclined at an acute angle or an obtuse angle with respect to one side of the electronic component and extending in a direction away from the electronic component; and
   a thermal interface material disposed between the at least one connection part and the printed circuit board,
   wherein the heat radiating member comprises at least one element hole in which at least one other electronic component is disposed.

2. The printed circuit board assembly as claimed in claim 1, wherein the printed circuit board comprises a first layer, an insulating layer, and a second layer which are sequentially stacked,
   the electronic component is mounted on the first layer, and
   the at least one connection part is configured to transfer the heat conducted through the heat radiating member to the second layer.

3. The printed circuit board assembly as claimed in claim 2, further comprising a plurality of via holes,
   wherein the at least one connection part is connected to the second layer through the plurality of via holes.

4. The printed circuit board assembly as claimed in claim 3, wherein the plurality of via holes are plated with a thermal conductive material.

5. The printed circuit board assembly as claimed in claim 4, wherein the at least one connection part comprises a plurality of connection pins which are inserted into the plurality of via holes.

6. The printed circuit board assembly as claimed in claim 2, wherein the thermal interface material is formed of a flexible material and fills a void between the at least one connection part and the first layer.

7. The printed circuit board assembly as claimed in claim 2, wherein the printed circuit board comprises a step part that is recessed toward the second layer from the first layer and exposes a portion of the second layer, and
   the at least one connection part is disposed in the step part and contacts the portion of the second layer.

8. The printed circuit board assembly as claimed in claim 3, wherein the heat radiating member comprises a heat radiating plate which contacts the electronic component, and the at least one connection part supports the heat radiating plate.

9. The printed circuit board assembly as claimed in claim 3, wherein the plurality of via holes are arranged in the direction away from the electronic component.

10. The printed circuit board assembly as claimed in claim 8, wherein the at least one connection part comprises:
    a supporting part supporting the heat radiating plate; and
    a contact part bent from the supporting part and contacting the first layer.

11. The printed circuit board assembly as claimed in claim 8, wherein the heat radiating plate and the at least one connection part are formed integrally with each other.

12. The printed circuit board assembly as claimed in claim 2, wherein the second layer is a ground layer.

13. The printed circuit board assembly as claimed in claim 3, further comprising a plurality of elements connected to the second layer to discharge the heat conducted from the second layer to an exterior.

14. The printed circuit board assembly as claimed in claim 1, wherein the at least one connection part forms a boundary of the at least one element hole.

15. The printed circuit board assembly as claimed in claim 1, wherein the at least one connection part extends in the direction along a line intersecting the electronic component.

16. A printed circuit board assembly comprising:
    a printed circuit board comprising a ground layer;
    an electronic component mounted on a side of the printed circuit board;
    at least one element mounted on the printed circuit board around the electronic component;
    a heat radiating member which contacts the electronic component and is configured to receive and conduct heat generated by the electronic component, the heat radiating member having a size to cover the electronic component and the at least one element; and
    at least one connection part connecting the printed circuit board and the heat radiating member and configured to transfer the heat conducted through the heat radiating member to the printed circuit board, the at least one connection part being located at an internal portion of the heat radiating member, the at least one connection part being inclined at an acute angle or an obtuse angle with respect to one side of the electronic component and extending in a direction away from the electronic component,
    wherein the heat radiating member comprises at least one element hole in which at least one other electronic component is disposed.

17. The printed circuit board assembly as claimed in claim 16, wherein the printed circuit board comprises a plurality of via holes, and
    the at least one connection part contacts at least one via hole from among the plurality of via holes to thereby be connected to the ground layer.

18. A printed circuit board assembly comprising:
    a printed circuit board comprising a wiring pattern;
    an electronic component mounted on the wiring pattern of the printed circuit board; and
    a heat radiating member which contacts the electronic component, the heat radiating member having at least one element hole formed therein; and
    at least one other electronic component mounted on the printed circuit board and disposed in the at least one element hole of the heat radiating member,
    wherein the heat radiating member comprises a plurality of connection parts connected to the printed circuit board to conduct heat conducted from the electronic component to the printed circuit board, each of the plurality of connection parts being located at an internal portion of the heat radiating member, and
the plurality of connection parts are inclined at an acute angle or an obtuse angle with respect to one side of the electronic component and extending in a direction away from the electronic component around the electronic component without interfering with the wiring pattern.

* * * * *